United States Patent
Lee et al.

(10) Patent No.: US 8,400,218 B2
(45) Date of Patent: Mar. 19, 2013

(54) CURRENT MODE POWER AMPLIFIER PROVIDING HARMONIC DISTORTION SUPPRESSION

(75) Inventors: Cheol-Woong Lee, San Jose, CA (US); Sunghyun Park, Cupertino, CA (US); Jonghoon Choi, San Jose, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 62 days.

(21) Appl. No.: 12/946,697

(22) Filed: Nov. 15, 2010

(65) Prior Publication Data

US 2012/0119835 A1 May 17, 2012

(51) Int. Cl.
*H03F 3/45* (2006.01)
(52) U.S. Cl. .................................. 330/257; 330/261
(58) Field of Classification Search .............. 330/257, 330/261, 253
See application file for complete search history.

(56) References Cited

U.S. PATENT DOCUMENTS

| | | | |
|---|---|---|---|
| 5,200,655 A | 4/1993 | Feldt | |
| 5,517,143 A | 5/1996 | Gross | |
| 5,812,022 A * | 9/1998 | Hirano et al. | 327/563 |
| 5,883,539 A | 3/1999 | Kimura | |
| 6,501,333 B1 * | 12/2002 | Sigurdardottir et al. | 330/252 |
| 6,684,064 B2 | 1/2004 | Kazakevich et al. | |
| 6,816,017 B2 | 11/2004 | Yamashita et al. | |
| 6,980,052 B1 | 12/2005 | Stroet | |
| 7,167,049 B2 * | 1/2007 | Lim | 330/253 |
| 7,218,170 B1 | 5/2007 | Carter et al. | |
| 7,505,750 B2 | 3/2009 | Lee et al. | |
| 7,570,930 B2 | 8/2009 | Eisenhut et al. | |
| 7,639,078 B2 * | 12/2009 | Rayanakorn et al. | 330/255 |
| 7,656,229 B2 | 2/2010 | Deng et al. | |
| 7,911,277 B2 * | 3/2011 | Paul et al. | 330/305 |
| 2005/0213672 A1 | 9/2005 | Lin et al. | |
| 2007/0182399 A1 * | 8/2007 | Enjalbert | 323/315 |
| 2010/0029228 A1 | 2/2010 | Holden et al. | |
| 2010/0159853 A1 | 6/2010 | Guerra et al. | |

FOREIGN PATENT DOCUMENTS

| | | |
|---|---|---|
| GB | 2319130 A | 5/1998 |
| WO | WO0070743 A1 | 11/2000 |

OTHER PUBLICATIONS

Hu et al., "A Fully Integrated Variable-Gain Multi-tanh Low-Noise Amplifier for Tunable FM Radio Receiver Front-End", IEEE Transactions on Circuits and Systems I: Regular Papers, Aug. 1, 2008, pp. 1805-1814, vol. 55, No. 7, IEEE, XP011224962, ISSN: 1549-8328.
International Search Report and Written Opinion—PCT/US2011/060630—ISA/EPO—Mar. 19, 2012.

* cited by examiner

*Primary Examiner* — Henry Choe
(74) *Attorney, Agent, or Firm* — Ramin Mobarhan

(57) ABSTRACT

A current mode power amplifier includes a current steering stage configured to steer a scaled current based on differential voltage inputs, a filtered current mirror connected to the current steering stage to receive the scaled current and produce a filtered output current, and a resonant load configured to receive the output current and generate an output voltage signal for transmission.

27 Claims, 6 Drawing Sheets

CURRENT MODE POWER AMPLIFIER PROVIDING HARMONIC DISTORTION SUPPRESSION

BACKGROUND

1. Field

The present application relates generally to the operation and design of amplifiers, and more particularly, to a current mode power amplifier providing harmonic distortion suppression.

2. Background

High quality signal transmission and reception is especially important in portable devices. Typically, such devices include a power amplifier to transmit a signal comprising a fundamental frequency carrying desired information. In addition, many devices include a variety of on-chip subsystems that operate concurrently with the power amplifier.

Unfortunately, during operation, a power amplifier may produce harmonic distortions which comprise undesirable frequencies harmonically related to the fundamental frequency being amplified. The transmission of such harmonic distortions may degrade system performance. It is also possible for the generated harmonic distortions to couple into on-chip subsystems to degrade their performance as well.

Therefore, it would be desirable to have a power amplifier that provides harmonic distortion suppression to avoid transmission of such distortions and to prevent or minimize on-chip coupling to other subsystems.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

The disclosed system provides a novel current mode power amplifier that provides improved harmonic distortion suppression.

Figure 1:
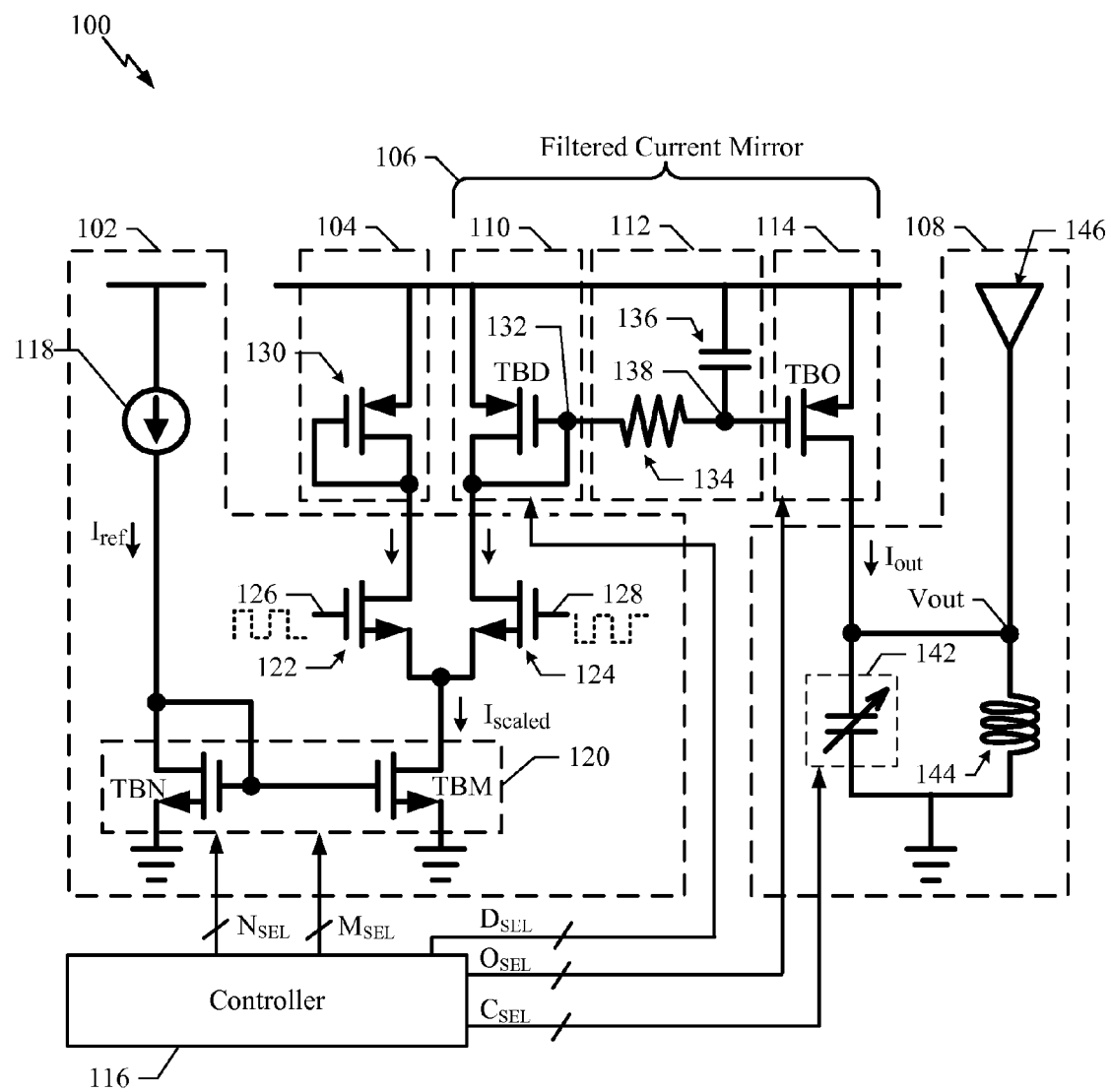
FIG. 1 shows an exemplary current mode power amplifier constructed in accordance with the present invention.

FIG. 1 shows an exemplary current mode power amplifier 100 constructed in accordance with the present invention. The amplifier 100 is suitable for use in transmission circuitry found in a variety of devices. The amplifier 100 comprises current steering stage 102, balancing load 104, filtered current mirror 106, and resonant load 108. The filtered current mirror 106 comprises a current to voltage (I-V) converter 110, low pass filter 112 and a voltage to current (V-I) converter 114. The amplifier 100 also comprises a controller 116.

The current steering stage 102 comprises a current source 118 that is connected to inject a reference current ($I_{ref}$) into a current scaling transistor bank 120. The current source 118 comprises any suitable current source. The current scaling transistor bank 120 comprises NMOS transistor banks (TBN) and (TBM). The current scaling transistor bank 120 receives current scaling selection signals ($N_{SEL}$ and $M_{SEL}$) from the controller 116. The current scaling selection signals $N_{SEL}$ and $M_{SEL}$ comprise one or more bits that operate to enable the operation of one or more transistors of the (TBN) and (TBM) transistor banks.

The current scaling transistor bank 120 operates to generate a scaled current ($I_{scaled}$) that is a scaled version of the reference current ($I_{ref}$). The $N_{SEL}$ and $M_{SEL}$ signals controls how the reference current $I_{ref}$ is scaled to produce the scaled current $I_{scaled}$. In one implementation, the scaled current ($I_{scaled}$) is determined from a ratio of the number of transistors turned on in the transistor bank TBM to the number of transistors turned on in the transistor bank TBN. A more detailed description of the current scaling transistor bank 120 is provided in another section of this document.

The current steering stage 102 also comprises a differential NMOS transistor pair 122 and 124. The transistor pair 122, 124 receives differential input voltage signals as input to their gate terminals 126 and 128, respectively. For example, in one implementation, the differential input voltage signals are complementary large signal square waveforms.

During operation, the transistors 122, 124 are alternately "turned on" by the differential input voltage signals. For example, when transistor 122 is turned on by the input voltage signal at gate terminal 126, a current equivalent to $I_{scaled}$ is steered through the transistor 122 from the balancing load 104. At the same time, the transistor 124 is turned off by its input voltage signal at its gate terminal 128. The balancing load 104 comprises PMOS transistor 130 and operates to allow a current equivalent to $I_{scaled}$ to flow to the drain of the transistor 122, thereby providing the benefit of signal matching.

Similarly, when transistor 124 is turned on by input voltage signal at its gate terminal 128, a current equivalent to $I_{scaled}$ is steered through the transistor 124 from the I-V converter 110. At the same time, the transistor 122 is turned off by its input voltage signal at its gate terminal 126. The (I-V) stage 110 comprises PMOS transistor bank (TBD) and operates to allow a current equivalent to $I_{scaled}$ to flow to the drain of the transistor 124.

The PMOS transistor bank TBD operates to convert the scaled current $I_{scaled}$ into an intermediate voltage that appears at node 132. The intermediate voltage at the node 132 is input to the low pass filter 112. The PMOS transistor bank TBD receives a selection signal $D_{SEL}$ from the controller 116, which determines the number of transistors that are turned on in the transistor bank TBD to convert the scaled current $I_{scaled}$ to the intermediate voltage at node 132. In another implementation, the transistor bank TBD is hardwired with a pre-determined number of PMOS transistors that are connected in a parallel fashion to convert the scaled current $I_{scaled}$ to the intermediate voltage at node 132.

The low pass filter 112 comprises a resistor 134 and capacitor 136. The low pass filter 112 operates to filter the intermediate voltage to produce a filtered voltage that appears at node 138. The filtered voltage at node 138 is input to the V-I stage 114. It should also be noted that the low pass filter 112 is not limited to the implementation shown in FIG. 1 and may be implemented as an active filter, high order filter, or any other type of low pass filter.

The V-I stage 114 comprises PMOS transistor bank TBO. The transistor bank TBO receives the filtered voltage at node 138 and convert this filtered voltage to an output current ($I_{out}$), which may also be referred to as a filtered output current. The PMOS transistor bank TBO receives a selection signal $O_{SEL}$ from the controller 116, which determines the number of transistors that are turned on in the transistor bank TBO to convert the filtered voltage to the output current ($I_{out}$). The level of the output current ($I_{out}$) is determined by the $D_{SEL}$ and $O_{SEL}$ signals received from the controller 116. In one implementation, the output current ($I_{out}$) is determined from the following expression.

$$I_{out}=I_{scaled}*(CSO/CSD)$$

where CSO is the number of unit transistors turned on in the transistor bank TBO and CSD is the number of unit transistors turned on in the transistor bank TBD. A more detailed description of the V-I stage 114 is provided in another section of this document. The output current ($I_{out}$) is input to the resonant load 108.

The resonant load 108 comprises capacitor bank 142, inductor 144 and antenna 146. The capacitor bank 142 receives a selection signal ($C_{SEL}$) from the controller 116. The selection signal $C_{SEL}$ controls the amount of resulting capacitance provided by the capacitor bank 142, which accommodates a wide range of the resonant frequencies of the load 108. A more detailed description of the capacitor bank 142 is provided in another section of this document. An output voltage ($V_{out}$) is generated that is connected to the antenna 146 for transmission. It should be noted that the resonant load 108 may also comprise other implementations that includes inductive circuits, matching networks, or any other type of resonant circuit.

The controller 116 comprises hardware and/or hardware executing software and is configured to generate the $N_{SEL}$, $M_{SEL}$, $D_{SEL}$, $O_{SEL}$ and $C_{SEL}$ selection signals to obtain a desired output dynamic range and a desired resonant frequency of the load 108. For example, in one implementation, the controller 116 is initialized with the values of the $N_{SEL}$, $M_{SEL}$, $D_{SEL}$, $O_{SEL}$ and $C_{SEL}$ signals. In another implementation, the controller 116 maintains the values of the $N_{SEL}$, $M_{SEL}$, $D_{SEL}$, $O_{SEL}$ and $C_{SEL}$ signals in a memory and outputs selected values to achieve a desired performance level for the amplifier 100. In still another implementation, the controller 116 generates the values of the $N_{SEL}$, $M_{SEL}$, $D_{SEL}$, $O_{SEL}$ and $C_{SEL}$ signals based on feedback or other information signals received by the controller 116 during operation of the amplifier 100. A more detailed description of the $N_{SEL}$, $M_{SEL}$, $D_{SEL}$, $O_{SEL}$ and $C_{SEL}$ signals is provided in another section of this document. It should also be noted that the various transistor banks of the amplifier 100 may be hardwired with pre-determined configurations of transistors so that the selection signals are not necessary to obtain a desired level of performance.

Thus, the current mode power amplifier 100 generally comprises two stages. The first stage is the current steering stage 102, which performs current scaling and current steering. For example, the current scaling transistor bank 120 operates to scale the reference current $I_{ref}$ to produce the scaled current $I_{scaled}$. The differential pair 122 and 124 steer the scaled current $I_{scaled}$ based on the input voltage signals at gate terminals 126 and 128.

The second stage is a current amplifier comprising the balancing load 104, filtered current mirror 106 and the resonant load 108. The balancing load 104 provides the benefit of signal matching. The filtered current mirror 106 converts the scaled current $I_{scaled}$ into the output current $I_{out}$. The resonant load 108 receives the output current $I_{out}$ and converts it to the output voltage ($V_{out}$). Thus, any non-linearity that may be generated is only generated in the first stage and is not regenerated in the second stage due to the linear operation of the filtered current mirror 106.

Furthermore, there is no additional DC current consumption due to the implementation of low pass filter 112; however, this filter is powerful in attenuating high order harmonics. The output dynamic range of the amplifier 100 is high because of the wide range of output current scaling. The output voltage is not sensitive to the input voltage amplitude because the input voltages are used as the switches to steer the scaled current, which is almost independent from the input voltage amplitude.

Therefore, the amplifier 100 operates to provide improved harmonic distortion suppression, reduced power consumption, increased output dynamic range and insensitivity to the input voltage amplitude.

Figure 2:
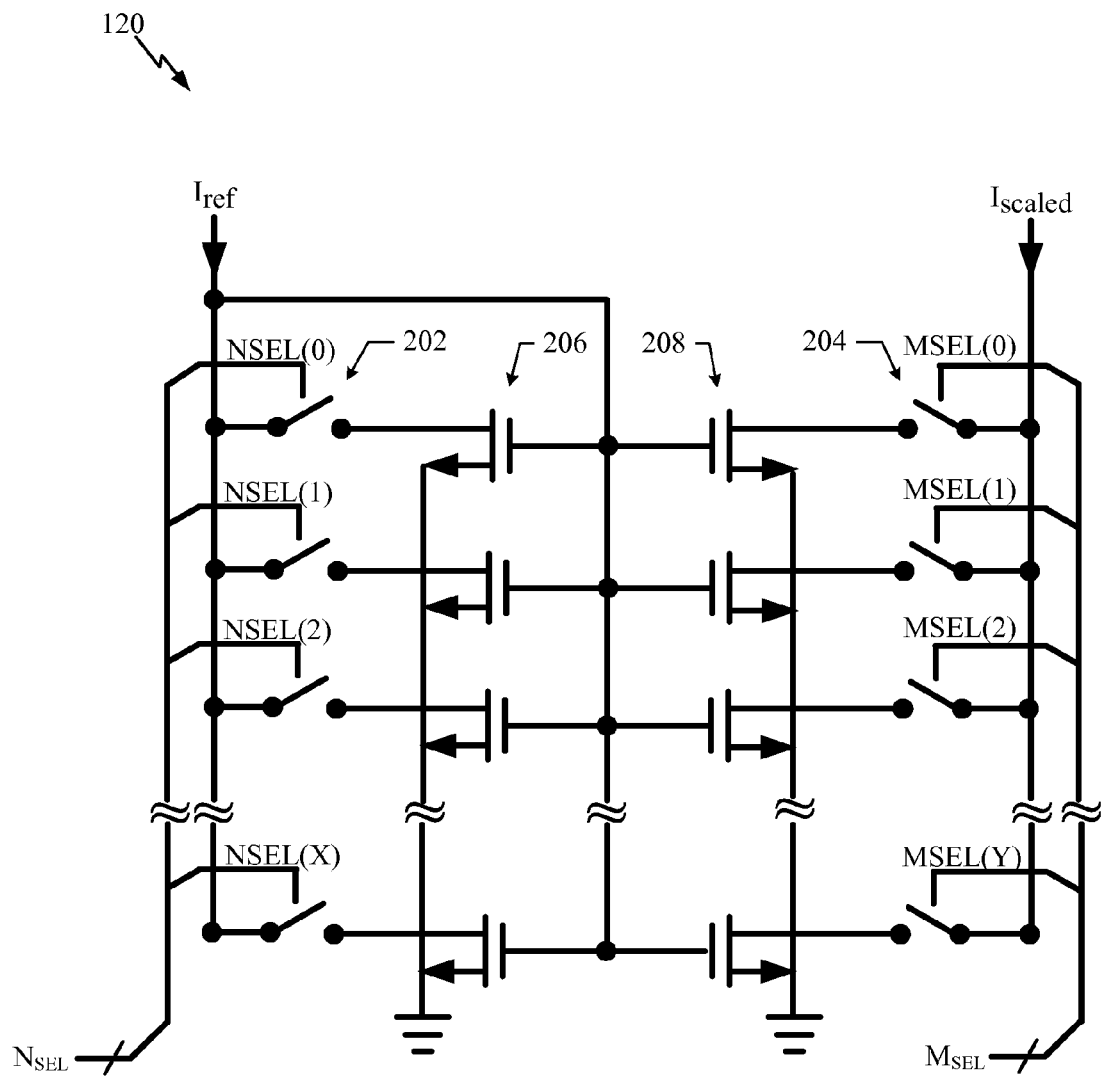
FIG. 2 shows an exemplary current scaling transistor bank constructed in accordance with the present invention.

FIG. 2 shows a detailed view of the current scaling transistor bank 120 shown in FIG. 1. The transistor bank 120 receives the reference current $I_{ref}$ and produces the scaled current $I_{scaled}$. The $N_{SEL}$ and $M_{SEL}$ signals determine how the $I_{ref}$ current is scaled to produce the $I_{scaled}$ current.

The $N_{SEL}$ and $M_{SEL}$ signals comprises a plurality of selection bits that are connected to two switch banks, shown generally at 202 and 204. For example, the $N_{SEL}$ signal comprises bits (0 to X) and the $M_{SEL}$ signal comprises bits (0 to Y). The switch banks 202 and 204 are connected to two NMOS transistor banks, TBN and TBM, shown generally at 206 and 208.

During operation, the number of NMOS transistors that are activated by the $N_{SEL}$ and $M_{SEL}$ signals determines how the $I_{ref}$ current is scaled to produce the $I_{scaled}$ current. In one implementation, the $I_{scaled}$ current is determined from the following expression.

$$I_{scaled}=I_{ref}*(CSM/CSN)$$

where CSM is the number of unit transistors turned on in the TBM transistor bank by the $M_{SEL}$ signal and CSN is the number of unit transistors turned on in the TBN transistor bank by the $N_{SEL}$ signal.

Thus, the ratio of the number of unit transistors turned on in the TBM transistor bank to the number of unit transistors turned on in the TBN transistor bank determines how the $I_{ref}$ current is scaled to produce the $I_{scaled}$ current.

Figure 3:
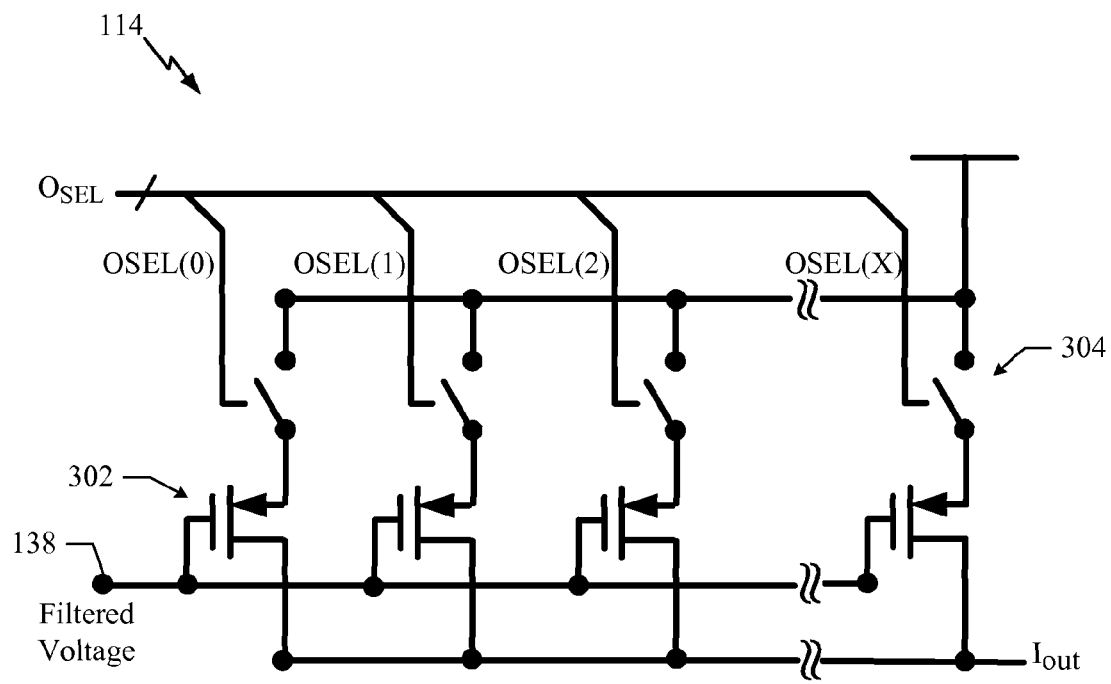
FIG. 3 shows an exemplary V-I converter constructed in accordance with the present invention.

FIG. 3 shows a detailed view of the V-I converter 114 shown in FIG. 1. The V-I converter 114 receives the filtered voltage at node 138 and converts this voltage to the output current $I_{out}$. The $D_{SEL}$ and $O_{SEL}$ signals determine how the filtered voltage is converted to the $I_{out}$ current.

In one implementation, the V-I converter 114 comprises the PMOS transistor bank TBO, shown generally at 302 that is connected to a switch bank, shown generally at 304. The $O_{SEL}$ signal comprises a plurality of selection bits which are connected to the switch bank 304. For example, the $O_{SEL}$ signal comprises bits (0 to X).

During operation, the bits of the $O_{SEL}$ selection signal close one or more of the switches in the switch bank 304 and thereby connect corresponding transistors of the TBO transistor bank 302 into the signal path.

The transistor bank TBD is similarly configured to the transistor bank TBO and is therefore not shown in a separate Figure. During operation, the bits of the $D_{SEL}$ selection signal close one or more switches of a switch bank to connect corresponding transistors of the TBD transistor bank into the signal path.

The connection of the transistors of the transistor banks TBD and TBO operates to adjust the level of the $I_{out}$ signal. For example, as described above, the current $I_{out}$ is determined from the number of transistors turned on in the transistor bank TBO and the transistor bank TBD.

Figure 4:
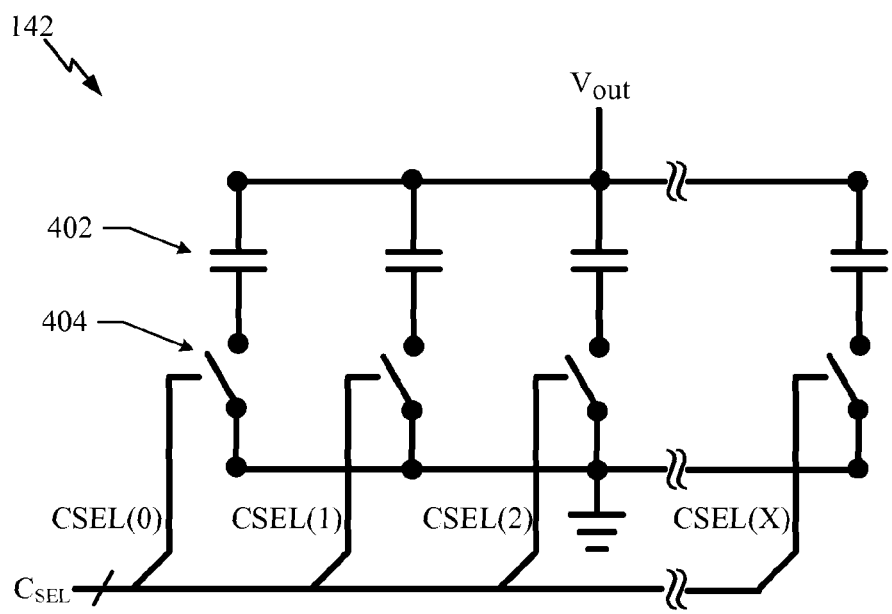
FIG. 4 shows an exemplary capacitor bank constructed in accordance with the present invention.

FIG. 4 shows a detailed view of the capacitor bank 142 shown in FIG. 1. The capacitor bank 142 and the inductor 144 are connected in parallel and receive the $I_{out}$ current to produce the output voltage $V_{out}$. The $C_{SEL}$ signal determines how much capacitance is provided by the capacitor bank 142.

In one implementation, the capacitor bank 142 comprises a bank of unit capacitors, shown generally at 402, that is connected to a switch bank, shown generally at 404. The $C_{SEL}$ signal comprises a plurality of selection bits (0 to X) that are connected to the switch bank 404.

During operation, the bits of the $C_{SEL}$ selection signal close one or more of the switches in the switch bank 404 and thereby connect corresponding capacitors of the bank of unit capacitors 402 into the signal path. The connection of one or more of the capacitors into the signal path operates to adjust the resulting capacitance of the capacitor bank 142.

Figure 5:
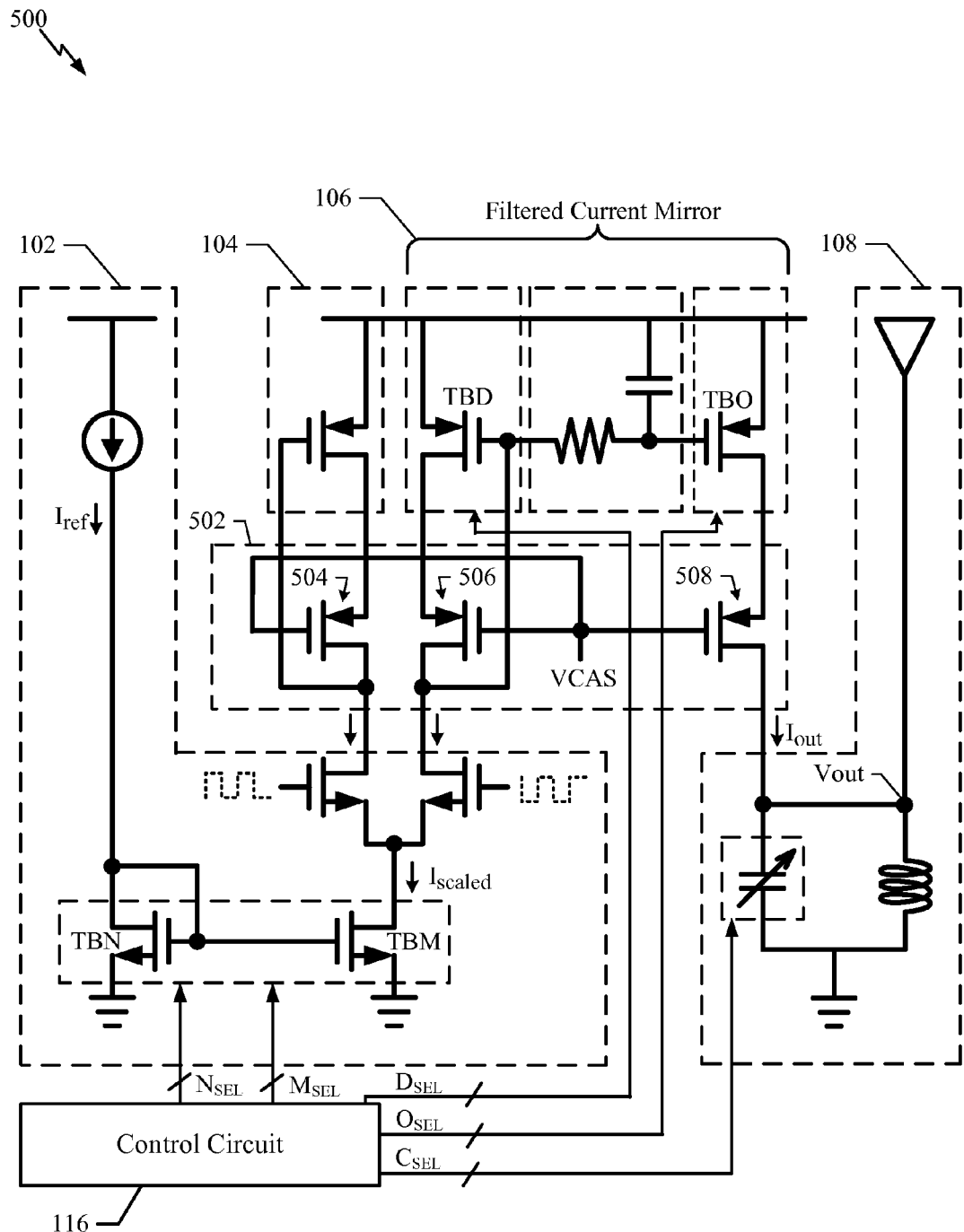
FIG. 5 shows an exemplary current mode power amplifier configured in a cascode topology.

FIG. 5 shows an exemplary current mode power amplifier 500 configured in a cascode topology. For example, the amplifier 500 comprises the amplifier 100 shown in FIG. 1 and further comprises cascode stage 502.

The cascode stage 502 comprises PMOS transistors 504, 506 and 508. The PMOS transistors 504 and 506 are connected between the current steering stage 102, the balancing load 104, and filtered current mirror 106. The PMOS transistor 508 is connected between the filtered current mirror 106 and the resonant load 108. The gate terminals of the transistors 504, 506 and 508 are connected to a cascode bias signal (VCAS) which operates to bias the cascode stage 502.

During operation, the output resistance provided by the cascode stage 502 is larger than what is provided by the transistors utilized in the amplifier 100. For example, with reference to the transistor 508, this transistor increases the total tank Q of the load by increasing the resonant impedance to achieve a higher voltage swing with a given current consumption. Because the cascode topology provides a higher tank Q, higher order harmonic distortions are further attenuated. Therefore, the amplifier 500 operates to provide even more harmonic distortion suppression than the amplifier 100.

Figure 6:
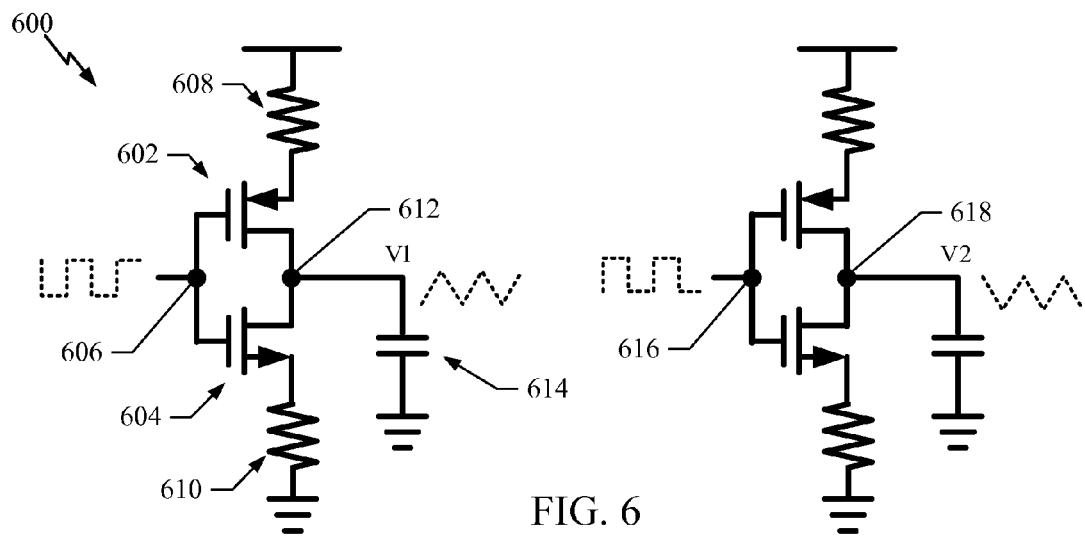
FIG. 6 shows an exemplary pre-driver stage for use with current mode power amplifiers.

FIG. 6 shows an exemplary pre-driver stage 600 for use with the current mode power amplifiers 100 and 500 described above.

The pre-drive stage 600 comprises PMOS transistor 602 and NMOS transistor 604. The transistors 602 and 604 have their gate terminals connected together at an input terminal 606 to receive a first square waveform voltage input. The transistor 602 has its source terminal connected to a power source through resistor 608. The transistor 604 has its source terminal connected to ground through resistor 610. The transistors 602 and 604 have their drain terminals connected together at an output terminal 612 to output a first saw tooth waveform (V1). The output terminal 612 is also connected to ground through capacitor 614.

A similar circuit is also provided to receive a second square waveform voltage input at input terminal 616 to produce a second saw tooth waveform (V2) at output terminal 618.

Therefore, V1 and V2 form differential saw tooth waveforms. The pre-driver 600 operates to convert differential square waveform voltage inputs to differential saw tooth waveform voltage outputs that can be used as input signals to the amplifiers 100 and 500. Using the saw-tooth waveforms as inputs to the amplifiers 100 and 500 results in additional harmonic distortion suppression, as illustrated below with reference to FIG. 7.

Figure 7:
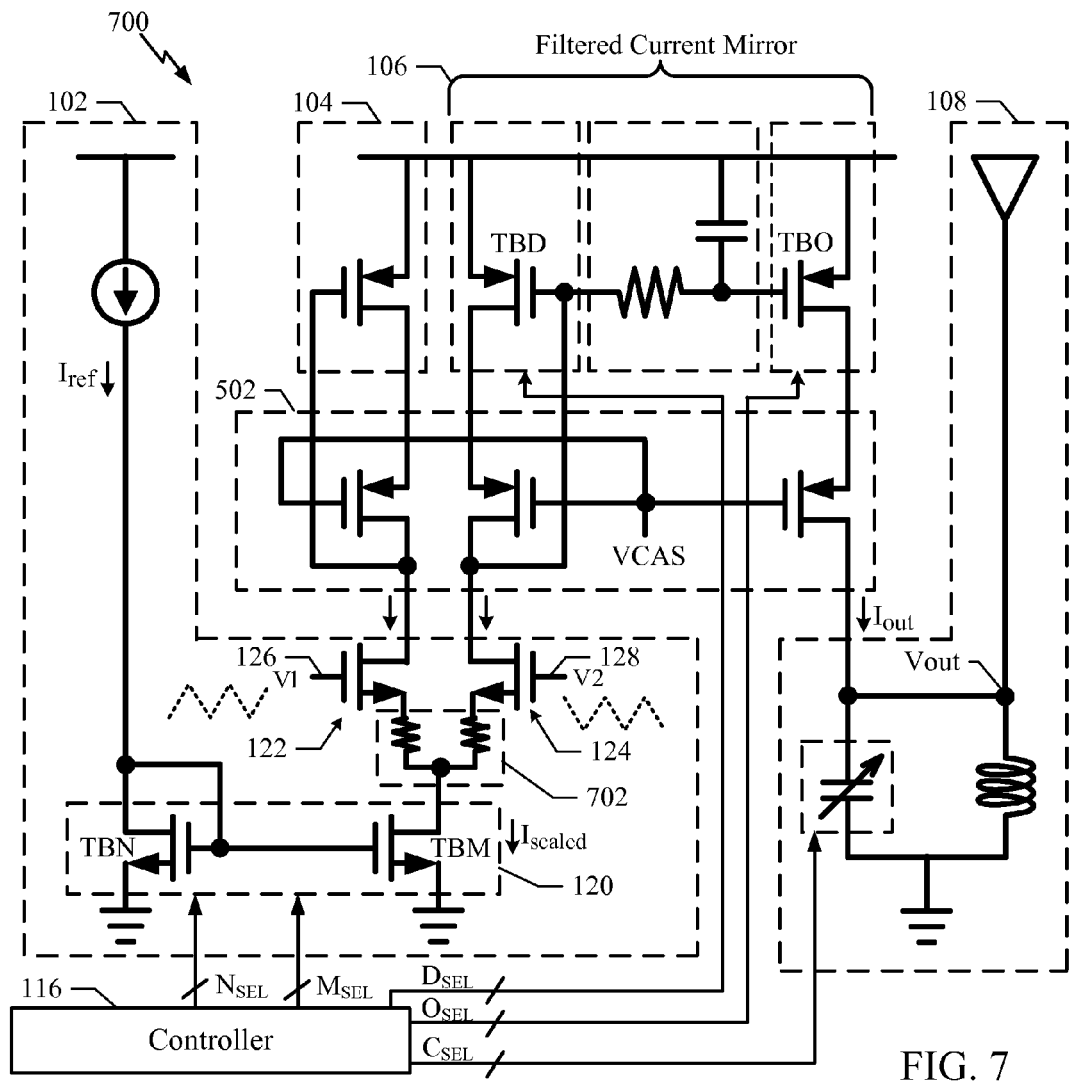
FIG. 7 shows an exemplary current mode power amplifier constructed in accordance with the present invention.

FIG. 7 shows an exemplary current mode power amplifier 700 constructed in accordance with the present invention. For example, the amplifier 700 comprises the amplifier 500 shown in FIG. 5 and further comprises degeneration resistors 702. The amplifier 700 also receives as input, the differential saw tooth voltage signals V1 and V2 generated by the pre-driver stage 600 shown in FIG. 6.

The degeneration resistors 702 are connected between source terminals of NMOS transistors 122, 124 and the drain terminals of the NMOS transistor in the transistor bank TBM. The degeneration resistors 702 in the input differential pair make the differential pair more linear. The differential pair of the current steering stage 102 is not sensitive to process variations of the output voltages of the pre-driver 600. Simulations indicate that the amplifier 700 in conjunction with pre-driver 600 provides approximately 10~15 dB of additional harmonic distortion suppression.

Figure 8:
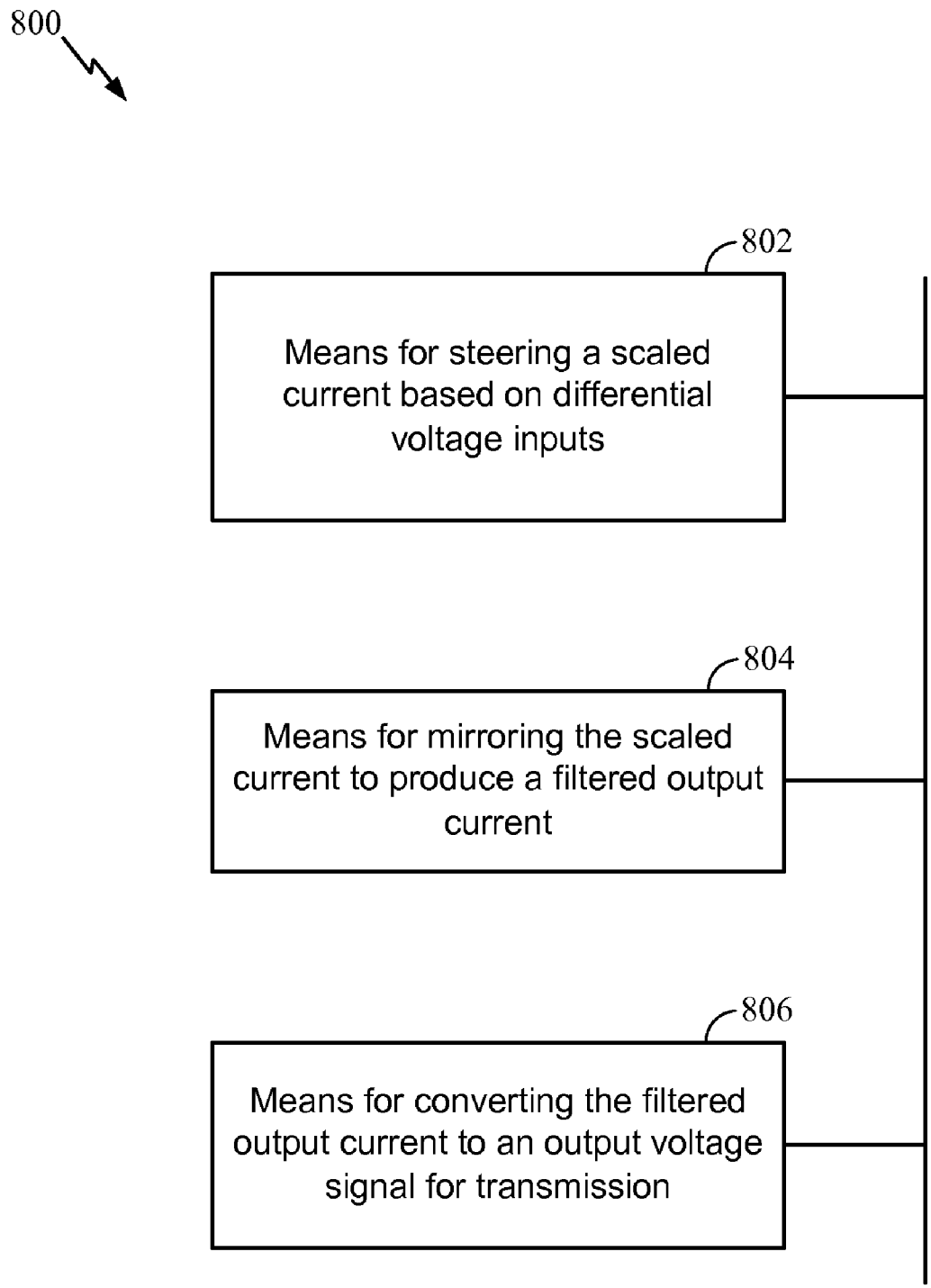
FIG. 8 shows an exemplary amplifier apparatus constructed in accordance with the present invention.

FIG. 8 shows an exemplary amplifier apparatus 800 constructed in accordance with the invention. For example, the amplifier apparatus 800 is suitable for use as the amplifier 100 shown in FIG. 1. In an aspect, the amplifier apparatus 800 is implemented by one or more modules configured to provide the functions as described herein. For example, in an aspect, each module comprises hardware and/or hardware executing software.

The amplifier apparatus 800 comprises a first module comprising means (802) for steering a scaled current based on differential voltage inputs, which in an aspect comprises the current steering stage 102.

The amplifier apparatus 800 also comprises a second module comprising means (804) for mirroring the scaled current to produce a filtered output current, which in an aspect comprises the filtered current mirror 106.

The apparatus 800 also comprises a third module comprising means (806) for converting the filtered output current to an output voltage signal for transmission, which in an aspect comprises the resonant load 108.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. A current mode power amplifier comprising:
   a current steering stage configured to steer a scaled current based on differential voltage inputs;
   a filtered current mirror connected to the current steering stage and includes a resistor and a capacitor connected between a diode connected transistor and current mirror transistor and configured to generate a filtered intermediate signal from the scaled current and produce an output current from the filtered intermediate signal; and
   a resonant load configured to receive the output current and generate an output voltage signal for transmission.

2. The amplifier of claim 1, further comprising a current scaling transistor bank connected to receive a reference current and generate the scaled current based on current scaling selection signals.

3. The amplifier of claim 2, the current scaling transistor bank comprising:
   at least one transistor bank; and
   at least one switch bank connected to the at least one transistor bank and configured to receive the current scaling selection signals, wherein selected bits of the current scaling selection signals close selected switches of the at least one switch bank to enable selected transistors of the at least one transistor bank to generate the scaled current.

4. The amplifier of claim 1, the current steering stage comprising a differential transistor pair connected to receive the differential voltage inputs to steer the scaled current.

5. The amplifier of claim 1, the filtered current mirror comprising:
   a current to voltage (I-V) converter connected to receive the scaled current from the current steering stage and generate an intermediate voltage;
   a low pass filter connected to receive the intermediate voltage and generate a filtered voltage; and
   a voltage to current (V-I) convertor connected to receive the filtered voltage and generate the output current based on an output selection signal.

6. The amplifier of claim 5, the V-I converter comprising:
a transistor bank; and
a switch bank connected to the transistor bank and configured to receive the output selection signal, wherein selected bits of the output selection signal close selected switches of the switch bank to enable selected transistors of the transistor bank to generate the output current.

7. The amplifier of claim 1, the resonant load comprising:
a capacitor bank; and
a switch bank connected to the capacitor bank and configured to receive a capacitance selection signal, wherein selected bits of the capacitance selection signal close selected switches of the switch bank to enable selected capacitors of the capacitor bank to combine to produce a resulting capacitance.

8. The amplifier of claim 1, further comprising a cascode stage connected to the resonant load to increase a tank Q by increasing a resonant impedance to achieve a higher voltage swing with a given current consumption.

9. The amplifier of claim 1, further comprising a pre-driver stage connected to the current steering stage, the pre-driver stage configured to transform first and second square waveforms to produce first and second saw-tooth waveforms as the differential voltage inputs.

10. The amplifier of claim 1, further comprising degeneration resistors coupled to the current steering stage.

11. The amplifier of claim 1, the resonant load comprising one or more of an inductive load, an LC tank circuit, a matching network, and an antenna.

12. A current mode power amplifier comprising:
means for steering a scaled current based on differential voltage inputs;
means for mirroring the scaled current to produce a filtered output current, and means includes a resistor and a capacitor connected between a diode connected transistor and current mirror transistor wherein a filtered intermediate signal generated from the scaled current is used to produce the filtered output current; and
means for converting the filtered output current to an output voltage signal for transmission.

13. The amplifier of claim 12, further comprising:
means for receiving a reference current; and
means for scaling the reference current based on current scaling selection signals to generate the scaled current.

14. The amplifier of claim 13, said means for scaling comprising:
at least one transistor bank; and
at least one switch bank connected to the at least one transistor bank and configured to receive the current scaling selection input, wherein selected bits of the current scaling selection input close selected switches of the at least on switch bank to enable selected transistors of the at least one transistor bank to generate the scaled current.

15. The amplifier of claim 12, said means for steering comprising a differential transistor pair connected to receive the differential voltage inputs to steer the scaled current.

16. The amplifier of claim 12, said means for mirroring the scaled current comprising:
means for generating an intermediate voltage from the scaled current;
means for generating a filtered voltage from the intermediate voltage; and
means for generating the filtered output current from the filtered voltage.

17. The amplifier of claim 16, said means for generating the filtered output current comprising:
a transistor bank; and
a switch bank connected to the transistor bank and configured to receive an output selection signal, wherein selected bits of the output selection signal close selected switches of the switch band to enable selected transistors of the transistor bank to generate the filtered output current.

18. The amplifier of claim 12, said means for converting the filtered output current comprising:
a capacitor bank; and
a switch bank connected to the capacitor bank and configured to receive a capacitance selection signal, wherein selected bits of the capacitance selection signal close selected switches of the switch bank to enable selected capacitors of the capacitor bank to combine to produce a resulting capacitance.

19. The amplifier of claim 12, said means for converting the filtered output current comprising cascode means for increasing a tank Q to achieve a higher voltage swing with a given current consumption.

20. The amplifier of claim 12, further comprising pre-driver means for filtering the differential voltage inputs.

21. The amplifier of claim 12, said means for converting the filtered output current comprising one or more of an inductive load, an LC tank circuit, a matching network, and an antenna.

22. A method for providing current mode power amplification, the method comprising:
steering a scaled current based on differential voltage inputs;
mirroring the scaled current to produce a filtered output current and mirroring includes a resistor and a capacitor connected between a diode connected transistor and current mirror transistor wherein a filtered intermediate signal generated from the scaled current is used to produce the filtered output current; and
converting the filtered output current to an output voltage signal for transmission.

23. The method of claim 22, further comprising:
receiving a reference current; and
scaling the reference current based on current scaling selection signals to generate the scaled current.

24. The method of claim 22, said mirroring the scaled current comprising:
generating an intermediate voltage from the scaled current;
generating a filtered voltage from the intermediate voltage; and
generating the filtered output current from the filtered voltage.

25. The method of claim 22, said converting comprising increasing a tank Q to achieve a higher voltage swing with a given current consumption.

26. The method of claim 22, further comprising filtering the differential voltage inputs.

27. The method of claim 22, said converting comprising converting the filtered output current with one or more of an inductive load, an LC tank circuit, a matching network, and an antenna.

* * * * *